United States Patent
Shih et al.

(10) Patent No.: US 10,270,474 B1
(45) Date of Patent: Apr. 23, 2019

(54) PARTIAL CONCATENATED CODING SYSTEM USING ALGEBRAIC CODE AND LDPC CODE

(71) Applicant: Storart Technology Co., Ltd., Hsinchu (TW)

(72) Inventors: Pei-Yu Shih, New Taipei (TW); Tsung-Yu Wu, Hsinchu (TW)

(73) Assignee: STORART TECHNOLOGY(SHENZHEN) CO., LTD., Shenzhen, Guangdong Province (CN)

( * ) Notice: Subject to any disclaimer, the term of this patent is extended or adjusted under 35 U.S.C. 154(b) by 0 days.

(21) Appl. No.: 15/890,432

(22) Filed: Feb. 7, 2018

(30) Foreign Application Priority Data

Jan. 31, 2018 (TW) .............................. 107103533 A

(51) Int. Cl.
*H03M 13/29* (2006.01)
*H03M 13/11* (2006.01)

(52) U.S. Cl.
CPC .... *H03M 13/2906* (2013.01); *H03M 13/1111* (2013.01); *H03M 13/2951* (2013.01)

(58) Field of Classification Search
CPC .......... H03M 13/2906; H03M 13/1111; H03M 13/2951
See application file for complete search history.

(56) References Cited

U.S. PATENT DOCUMENTS

| 7,770,090 | B1* | 8/2010 | Kons | ................. H03M 13/1137 714/780 |
| 2005/0149841 | A1* | 7/2005 | Kyung | .............. H03M 13/2957 714/800 |
| 2008/0082897 | A1* | 4/2008 | Brandman | .......... G06F 11/1068 714/763 |
| 2008/0092026 | A1* | 4/2008 | Brandman | .......... G06F 11/1072 714/793 |
| 2016/0179620 | A1* | 6/2016 | Bazarsky | ............. H03M 13/116 714/766 |
| 2017/0148510 | A1* | 5/2017 | Bazarsky | ............. G06F 11/1048 |
| 2017/0271031 | A1* | 9/2017 | Sharon | ................... G11C 29/42 |
| 2018/0032396 | A1* | 2/2018 | Sharon | ............... G11C 11/5642 |
| 2018/0253353 | A1* | 9/2018 | Takase | ............... G06F 11/1068 |

* cited by examiner

*Primary Examiner* — Kyle Vallecillo
(74) *Attorney, Agent, or Firm* — Jackson IPG PLLC; Demian K. Jackson

(57) ABSTRACT

A partial concatenated coding system using an algebraic code and LDPC code is disclosed. The partial concatenated coding system includes an ECC encoder, a received codeword monitoring module and an ECC decoder. The ECC encoder has a LDPC code encoding module and an algebraic code encoding module. The ECC decoder has a LDPC code decoding module and an algebraic code decoding module. Comparing with conventional concatenating coding systems, the present invention has advantages of less spare spaces, better error-correcting performance, lower hardware complexity, better decoding throughput and fixable code length.

12 Claims, 4 Drawing Sheets

PARTIAL CONCATENATED CODING SYSTEM USING ALGEBRAIC CODE AND LDPC CODE

FIELD OF THE INVENTION

The present invention relates to a coding system. More particularly, the present invention relates to a partial concatenated coding system using an algebraic code and a LDPC (Low Density Parity Check) code.

BACKGROUND OF THE INVENTION

With the demand for high-reliability transmission of information in digital communication channels and storage systems increasing, various error-correcting skills have been investigated and developed for such systems. They are applied to detect and correct the errors which are caused by a variety of factors, e.g. transmission channel noise, and retention and endurance of NAND flash.

Conventionally, algebraic codes, e.g. BCH code and RS code, are used in data transmission systems and provide certain error-correcting capacity. Due to user requirement and huge data transmission, stronger Error Correcting Codes (ECC) are needed to support higher raw bit errors to enhance the lifespan of associated devices. In order to enhance error correcting capacity, soft-values are applied for soft-decision decoding. Recently, Low Density Parity Check (LDPC) code which has excellent performance in soft-decision is widely applied in variety area. Soft-decoding method of LDPC codes is not only good at error correction capability, but also efficiently implemented in hardware. However, in applications, the input precision of the soft values will affect the error-correcting capacity when decoding. Moreover, the structure of the parity check matrix of LDPC codes leads to a phenomenon of error floor, which is the flatten region in the performance curve of Bit Error Rate (BER) versus Signal-to-Noise Ratio (SNR). This issue is very crucial for LDPC decoding. Especially, for some applications, the decoding performance requirement is at Frame Error Rate (FER)<$10^{-10}$. On the other hand, since high transmission rate of the storage data under cost consideration is required, the error-correcting capacity of ECC is limited due to the limited spare space of the parity.

In order to improve error-correcting capacity and solve the phenomenon of the error floor for LDPC codes, there are many ECC techniques applied. For example, product codes and concatenated codes are the popular ones. Take the concatenated codes for instance. The encoder for a conventional concatenated code of a ($n_1$, $k_1$) linear code $C_1$ and a ($n_2$, $k_2$) linear code $C_2$ is to first get a codeword $c_1$ via encoding message by using the linear code $C_1$, and then encode $c_1$ by using the linear code $C_2$ following the first encoding process to get the codeword c, where $k_1$<$n_1$=$k_2$<$n_2$. The code rate of the concatenated code is R=($k_1$)/($n_2$). Consequently, the concatenated code costs much spare space for double protecting and spends much operation time, i.e., encoding time and decoding time.

Therefore, an innovative concatenated coding system is still desired to settle all the issues above.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In order to settle the problems above, a partial concatenated coding system is provided. The partial concatenated coding system comprises: an ECC encoder, for encoding a message to a codeword having a first message part, a second message part, a first parity part and a second parity part to send out to a communication channel or a storage as a transmit codeword, comprising: a LDPC code encoding module, for encoding the message to a LDPC codeword having the first message part, the second message part and the first parity part; and an algebraic code encoding module, for encoding the second message part and the first parity part of the LDPC codeword and generating the second parity part by an algebraic code, wherein the ECC encoder concatenates the second parity part to the LDPC codeword; a received codeword monitoring module, for determining LLR (Log-likelihood Ratio) values of all code-bits of the transmit codeword from the communication channel or the storage; and an ECC decoder, for decoding the received codeword with LLR values from the received codeword monitoring module to obtain the message, sending out the message and/or parity parts if codeword decoding is successful, and sending out a decoding fail signal if codeword decoding is judged to be failed under a stop condition, comprising: a LDPC code decoding module, for decoding the first message part, the second message part and the first parity part of the transmit codeword with LLR values, using a feedback message for the second message part and first parity part to process decoding, and terminating decoding iterative operations when the number of the iterative operations meets a predetermined stop value or a stop condition for each run of decoding; and an algebraic code decoding module, for decoding the second message part, the first parity part and the second parity part of the received codeword with hard-bits from the LDPC code decoding module, generating a decoded message part and the first parity part by the algebraic code as the feedback message if decoding is successful, and providing the current second message part and first parity part as the feedback message if decoding is not successful.

Preferably, the algebraic code is BCH code or RS code.

Preferably, the stop condition is the maximum number of operations of the LDPC code decoding module used to decode the first message part, the second message part and the first parity part for one received codeword when a predetermined value is met, or decoding of the LDPC code decoding module for one received codeword is judged to be divergent.

Preferably, the second message part and the first parity part of the received codeword with LLR values from the LDPC code decoding module may be mapped to hard-bits before the algebraic code decoding module starts decoding processes.

According to the present invention, when the algebraic code decoding module successfully processes decoding, all code-bits of the decoded message part from the algebraic code decoding module are kept the same sign and assigned the maximum or minimum soft-bit value. Or when the algebraic code decoding module unsuccessfully processes decoding, the current second message part and first parity part as the feedback message are assigned the same soft-bit values before algebraic code decoding when they are sent by the algebraic code decoding module.

If some bits in the message part are assigned as zero by the algebraic code encoding module, the algebraic code decoding module generates the decoded message part further when the zeros are recognized by comparison after decoding.

Preferably, the predetermined stop value in a later run of the LDPC code decoding module for the codeword is larger than that of a current run of the LDPC code decoding module for the same codeword. The predetermined stop value for each run may be set based on physical conditions of the communication channel or the storage. Decoded information may be further sent to the received codeword monitoring module for determining the LLR values of the received codeword.

The partial concatenated coding system may further comprises a memory module, connected to the LDPC code decoding module, for temporarily buffering some information including the decoded message part and the decoded message part and the first parity part from the LDPC code decoding module or the algebraic code decoding module, or the message part and the first parity part with LLR values, and the second parity part with hard-bits from the received codeword monitoring module.

With the help of the algebraic code decoding module, decoding performance of the LDPC code decoding module can be improved. The phenomenon of the error floor the can be mitigated. Meanwhile, since the inner code (algebraic code) protects partial and special data of outer code (LDPC code), the partial concatenated coding system costs less spare space for double protecting and spends less operation time, i.e., encoding time and decoding time. Comparing with conventional concatenating coding system, the present invention has advantages of slight hardware complexity, better decoding throughput and fixable code length.

DETAILED DESCRIPTION OF THE PREFERRED EMBODIMENTS

The present invention will now be described more specifically with reference to the following embodiments.

Figure 1:
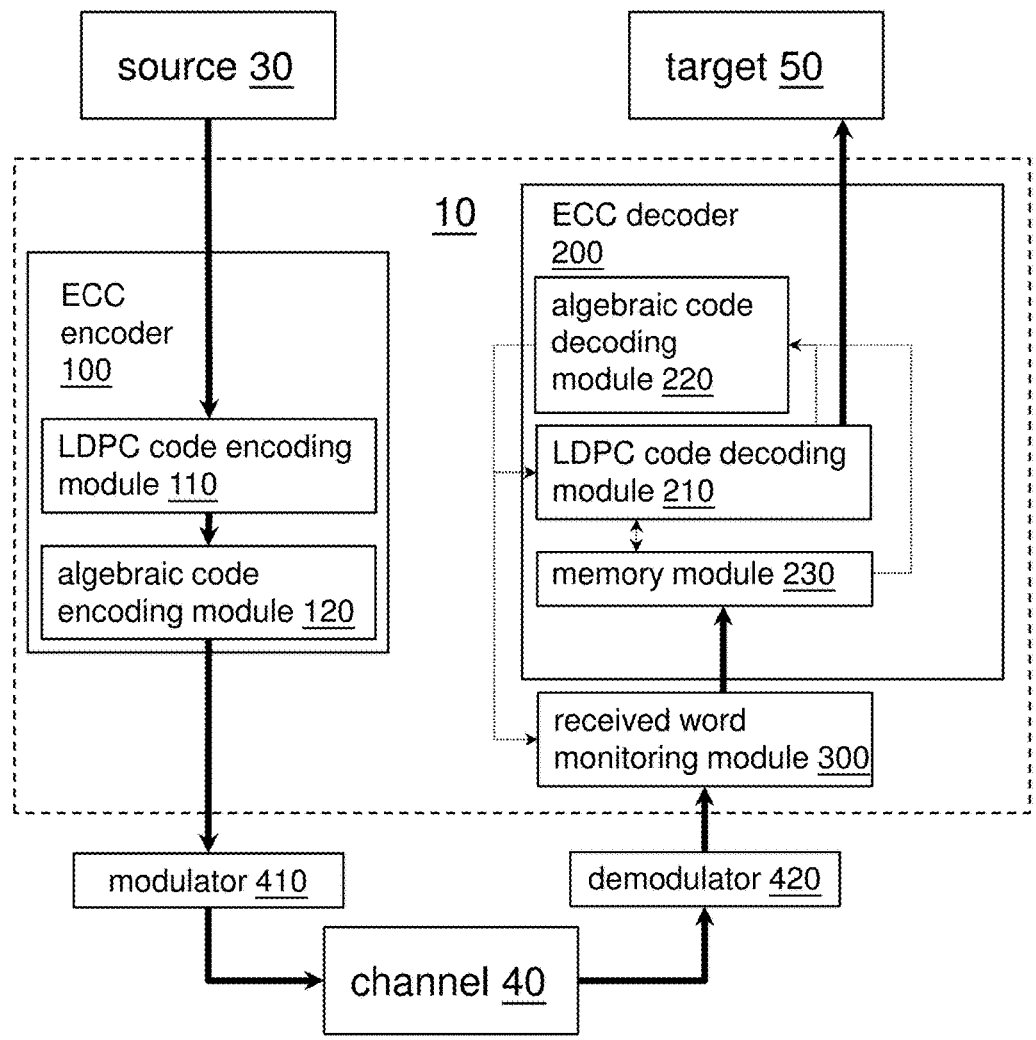
FIG. 1 is a schematic diagram of a partial concatenated coding system according to the present invention.
Figure 2:
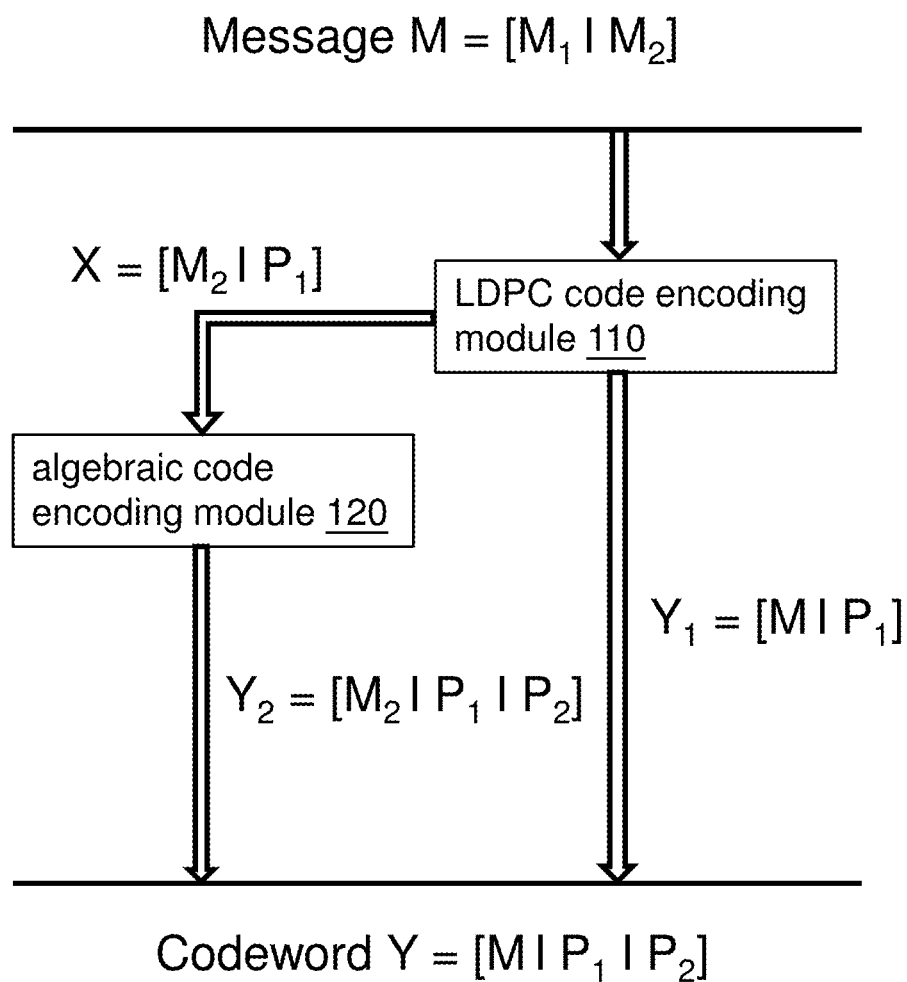
FIG. 2 illustrates how a message is encoded.
Figure 3:
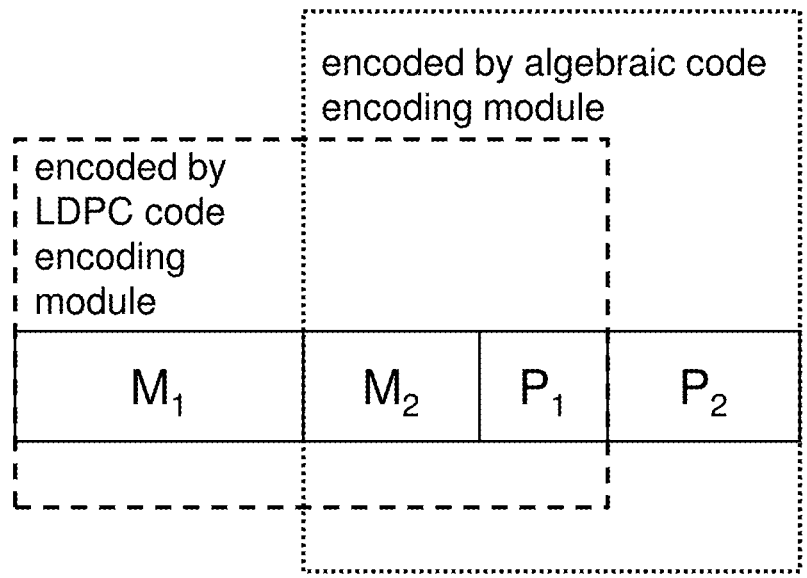
FIG. 3 shows the structure of a codeword.
Figure 4:
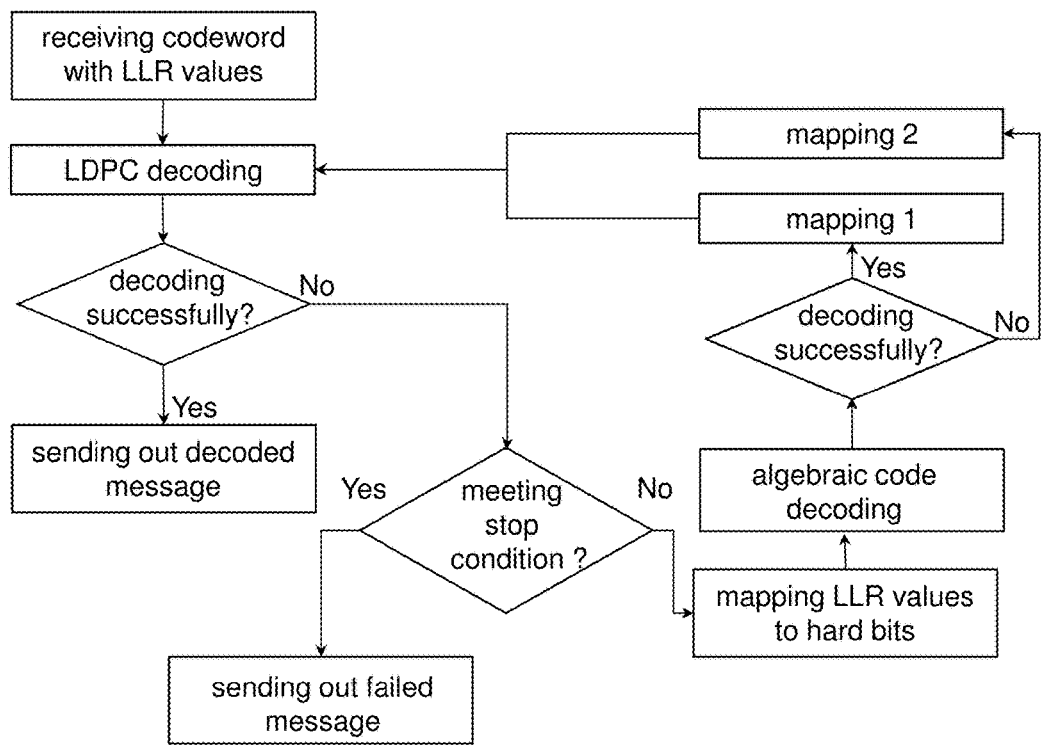
FIG. 4 is a flow chart of operation of the partial concatenated coding system.

Please refer to FIG. 1 to FIG. 4. An embodiment of a partial concatenated coding system 10 which uses an algebraic code and LDPC code according to the present invention is disclosed. FIG. 1 is a schematic diagram of the partial concatenated coding system 10, FIG. 2 illustrates how a message is encoded, FIG. 3 shows the structure of a codeword, and FIG. 4 is a flow chart of operation of the partial concatenated coding system 10. The partial concatenated coding system 10 includes an ECC encoder 100, a received codeword monitoring module 300 and an ECC decoder 200 as enclosed by long dash frame in FIG. 1. These elements are hardware and can be mounted in separate devices, e.g. the ECC encoder 100 in a transmitter and the received codeword monitoring module 300 and the ECC decoder 200 in a receiver. Functions of the modules and operation of the partial concatenated coding system 10 will be disclosed in details below.

The ECC encoder 100 is used to encoding a message to a codeword. Different from the structure of conventional codewords, the codeword from the ECC encoder 100 has two message parts and corresponding two parity parts. In order to have a comprehensive understanding, they are named a first message part, a second message part, a first parity part and a second parity part. Please refer to FIG. 2 and FIG. 3. The message (shown as M) to be protected is encoded by LDPC code and an algebraic code. In the present invention, the algebraic code can be BCH code or RS code; in the embodiment, the BCH code is used. Generally, "algebraic code" is used for associated nouns so that a broadest interpretation can be available. The original message comprises the first message part (shown as $M_1$) and the second message part (shown as $M_2$). When the message is encoded by a LDPC code encoding module 110 in the ECC encoder 100, the message ($M_1|M_2$) is processed and the first parity part (shown as $P_1$) is generated by the LDPC code. Thus, a LDPC codeword $Y_1$ is obtained as $[M|P_1]$. When the message is further encoded by an algebraic code encoding module 120 in the ECC encoder 100, not the whole message is used. Instead, the second message part $M_2$ and the first parity part $P_1$ are used as a new massage X to process and the second parity part (shown as $P_2$) is generated by the algebraic code (BCH code). An algebraic codeword $Y_2$ is obtained as $[M_2|P_1|P_2]$. The ECC encoder 100 concatenates the second parity part $M_2$ to the LDPC codeword to get the complete codeword, $Y=[M|P_1|P_2]$. It reveals a feature of the present invention: the inner code only protects a portion of the message. This saves area cost for hardware to implement the algebraic code operation.

Meanwhile, the ECC encoder 100 can send out the codeword Y to a communication channel or store Y in storage as a transmit codeword for further obtaining correct message from decoding. Here, the communication channel refers to any media used to carry and transmit the message, tangibly or invisibly. For example, the communication channel can be a USB connecting cable from one host to another. The communication channel can also be an open space where electromagnetic waves are modulated with messages from one source 30 to one target 50. The storage can be any devices, used for temporarily or long time store messages. HDD (Hard Disk Drive) or SSD (Solid State Drive) is an example of the storage. For noises in the communication channel or the storage, ECC has the feature to revert the correct messages.

As mentioned above, the ECC encoder 100 comprises the LDPC code encoding module 110 and an algebraic code encoding module 120. The LDPC code encoding module 110 encodes the message to the LDPC codeword which has the first message part, the second message part and the first parity part. The algebraic code encoding module 120 can encode the second message part and the first parity part of the LDPC codeword and generate the second parity part by the algebraic code. A work flow of the LDPC code encoding module 110 and the algebraic code encoding module 120 can be available from FIG. 2. It should be noticed that the ECC encoder 100 is configured in a device which is different from the one carries the ECC decoder 200. In other embodiment, the ECC encoder 100 and the ECC decoder 200 can be in installed in the same device. Therefore, some bridging modules would be required for the communication channel or the storage. In this embodiment, a channel 40 for transmitting the transmit codeword Y is an open space with modulated electromagnetic waves. Hence, a modulator 410 for modulating the transmit codeword Y is the bridging module.

When the transmit codeword Y is transmitted by the electromagnetic wave, inevitably, it would be interfered. More code-bits of the transmit codeword Y would be interfered and cause errors. After a received codeword R with noise (R=Y+noise) is demodulated by a demodulator 420, the received codeword R also needs to be organized before it can be further used. For LDPC soft-decision and hard-decision decoding processes, soft-bit and hard-bit data are required, respectively. It means that for soft-decision, code-bits of the received codeword R must be in the form of real number, for example, 12, 8, 5, 1, −1, −5, −8, −12 (Log-likelihood Ratio values, LLR values); for hard-decision, it must be 0 or 1. The main job function of the received codeword monitoring module 300 is to determine LLR values of all code-bits of the received codeword R from the channel 40 (or the storage is applied).

The ECC decoder 200 decodes the received codeword R with LLR values from the received codeword monitoring module 300 to obtain the message M. Meanwhile, the ECC decoder 200 can also send out the message M and/or parity parts if codeword decoding is successful. Otherwise, a decoding fail signal is sent out by the ECC decoder 200 if codeword decoding is judged to be failed under a stop condition. Intuitively, the ECC decoder 200 sends out the message M or the decoding fail signal to a next station (hereinafter, a target 50 is used) just like what a conventional ECC decoder does. However, the stop condition is able to have a better performance for the architecture based on the ECC decoder 200.

According to the present invention, the stop condition can be set to be the maximum number of operations of a LDPC code decoding module 210 (will be illustrated later) used to decode the first message part, the second message part and the first parity part of the received codeword R when a predetermined value is met. The LDPC code decoding module 210 and an algebraic code decoding module 220 are the basic elements of the ECC decoder 200. A received codeword with soft-information needs to travel several times between the LDPC code decoding module 210 and the algebraic code decoding module 220 to see if it can be reverted to corresponding message or the decoding fail signal is sent to the target 50. For the LDPC decoding processes, many iterations of calculation are required for one received codeword. It takes much time. Sometimes, the result from calculation may diverge. It means no correct message can be found under this situation. In order to settle the problems, the LDPC decoding processes of the LDPC code decoding module 210 break temporarily after a couple of iterations and algebraic decoding processes take over. Since the part, including a portion of the message M which is protected by the algebraic code is not large, partial correct second message part and first parity part of the message M can be soon achieved and fed back to the LDPC code decoding module 210. Therefore, several loops from the LDPC code decoding module 210 and the algebraic code decoding module 220 may be necessary. The stop condition is used to stop further loops in case of resource waste; even decoding of the received codeword is almost available when the stop condition comes. Since the LDPC code decoding module 210 can judge if decoding for a received codeword is divergent after a number of runs of loops, the stop condition can be set as operation of the LDPC code decoding module 210 for one received codeword still divergent after a preset number of runs as well. According to different environments of the channel 40 (or storage is used), the preset number of runs can be acquired by pre-experiments or simulative calculation.

As mentioned above, the ECC decoder 200 includes the LDPC code decoding module 210 and the algebraic code decoding module 220. The LDPC code decoding module 210 is used to decode the first message part, the second message part and the first parity part of received codeword with LLR values. Furthermore, it could use a feedback message for the second message part and first parity part to process decoding. The feedback message consists of a correct decoded message part of the second message part $M_2$ and the first parity part $P_1$ or just original second message part and first parity part the LDPC code decoding module 210 is provided by the algebraic code decoding module 220. Another job of the LDPC code decoding module 210 is to terminate decoding iterative operations when the number of the iterative operations meets a predetermined stop value or the stop condition is met for each run of decoding. This job function is another feature of the present invention. The rule for setting the predetermined stop value is: a predetermined stop value in a later run of the LDPC code decoding module 210 for the received codeword is larger than that of a current run of the LDPC code decoding module 210 for the same received codeword. An example of decoding a received message is 5 iterative operations in a first run of the LDPC code decoding module 210, 10 iterative operations in a second run of the LDPC code decoding module 210 and 15 iterative operations in a last run of the LDPC code decoding module 210 for one message. According to the spirit of the present invention, the number of runs is not limited to 3 and the number of iterative operations for each run is not restricted to 5, 10 and 15, respectively. The number of runs and the number of iterative operations for each run can be obtained by pre-experiments or simulative calculation for different communication channel or storage. The predetermined stop value or the stop condition for each run is set based on physical conditions of the communication channel or the storage.

The algebraic code decoding module 220 can decode the second message part, the first parity part and the second parity part of the received codeword with hard bits from the LDPC code decoding module 210 and the memory module 230 and generate the decoded message part (second message part) and the first parity part by the algebraic code as the feedback message if decoding is successful. However, if decoding is not successful, the algebraic code decoding module 220 provides a decoding fail signal to the LDPC code decoding module 210 and provides the current second message part and first parity part (stored in memory module 230) as the feedback message. If some bits in the message part are assigned as zero by the algebraic code encoding module 120, the algebraic code decoding module 120 generates the decoded message part further when the zeros are recognized by comparison after decoding. Namely, "success" is required in both the decoding processes and the comparison of zeros.

It should be emphasized that if needed, a memory module 230 can be applied. It is connected to the LDPC code decoding module 210 and algebraic code decoding module 220. It works for temporarily buffering the information used in the LDPC decoding module 210 and the decoded message part and the first parity part from the LDPC code decoding module 210 or the algebraic code decoding module 220, or the message part and the first parity part with LLR values, and the second parity part with hard-bits from the received codeword monitoring module 300. In addition, the decoded message part from the algebraic code decoding module 220 can be further sent to the received codeword monitoring module 300. The decoded message part can be used by the received codeword monitoring module 300 to determine the LLR values of the received codeword. Thus, the received codeword monitoring module 300 can be more efficiently and accurately in determining LLR values.

Please see FIG. 4. Operation of decoding of the partial concatenated coding system 10 and detailed functions of some elements are further illustrated below.

After the LLR values of code-bits of the received codeword R determined by the received codeword monitoring module 300, the LDPC code decoding module 210 starts to decode the received codeword R with the first message part, the second message part and the first parity part. After 5 iterative operations in a first run of the LDPC code decoding module 210, the ECC decoder 200 cannot decode successfully. It will check if the stop condition is met or not. If the answer is yes, the ECC decoder 200 will send out the decoding fail signal to the target 50. If the answer is not and decoding processes of the LDPC code decoding module 210 is not successfully yet, the ECC decoder 200 will ask the algebraic code decoding module 220 to decode the second message part, the first parity part and the second parity part with hard bit form. It should be noticed that there might be some code-bits flipped in the second message part and the first parity part in the decoding process of algebraic code decoding module 220. On the other hand, if the message M is successfully obtained within 5 iterative operations in a first run of the LDPC code decoding module 210, the ECC decoder 200 will pass the message M, the first parity part and the second parity part to the target 50.

Since the algebraic code decoding module 220 requests all code-bits received are hard-bits, the second message part and the first parity part with LLR values from the LDPC code decoding module 210 need to be mapped to hard-bits (0 or 1) before the algebraic code decoding module 220 starts decoding processes. If the algebraic code decoding module 220 successfully processes decoding, according to the requirement of the ECC decoder 200, code-bits of the decoded message part (correct second message part of the message M) and first parity part can be further processed as below. All code-bits of the decoded message part and first parity part are kept the same sign and assigned the maximum or minimum soft-bit value, such as 12 and −12. Otherwise, all code-bits of the decoded message part and first parity part are kept the original soft-bits from LDPC decoding module 210. Collectively, the process to deal with the correct decoded message part and first parity part is marked as "mapping 1" in FIG. 4. Mapping refers to a correspondence between a calculated value and an output value.

If the algebraic code decoding module 220 cannot successfully process decoding and when the feedback message is sent by the algebraic code decoding module 220, the current second message part and the current first parity part as the feedback message are assigned the same soft-bit values before algebraic code decoding. Then, the feedback message is sent back to the algebraic code decoding module 220. Similarly, this process is marked as "mapping 2" in FIG. 4.

Later, the ECC decoder 200 keeps decoding loops between the LDPC code decoding module 210 and the algebraic code decoding module 220. If the stop condition is set to be 4 times the LDPC code decoding module 210 used to decode, after 4 loops are finished and decoding result also fails, the ECC decoder 200 automatically terminates decoding the received codeword R and send out the decoding fail signal.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A partial concatenated coding system, comprising:
   an ECC encoder, for encoding a message to a codeword having a first message part, a second message part, a first parity part and a second parity part to send out to a communication channel or a storage as a received codeword, comprising:
      a LDPC code encoding module, for encoding the message to a LDPC codeword having the first message part, the second message part and the first parity part; and
      an algebraic code encoding module, for encoding the second message part and the first parity part of the LDPC codeword and generating the second parity part by an algebraic code, wherein the ECC encoder concatenates the second parity part to the LDPC codeword;
   a received codeword monitoring module, for determining LLR (Log-likelihood Ratio) values of all code-bits of the received codeword from the communication channel or the storage; and
   an ECC decoder, for decoding the received codeword with LLR values from the received codeword monitoring module to obtain the message, sending out the message and/or parity parts if codeword decoding is successful, and sending out a decoding fail signal if codeword decoding is judged to be failed under a stop condition, comprising:
      a LDPC code decoding module, for decoding the first message part, the second message part and the first parity part of the received codeword with LLR values, using a feedback message for the second message part and first parity part to process decoding, and terminating decoding iterative operations when the number of the iterative operations meets a predetermined stop value or a stop condition for each run of decoding; and
      an algebraic code decoding module, for decoding the second message part, the first parity part and the second parity part of the received codeword with hard-bits from the LDPC code decoding module, generating a decoded message part and the first parity part by the algebraic code as the feedback message if decoding is successful, and providing the current second message part and first parity part as the feedback message if decoding is not successful.

2. The partial concatenated coding system according to claim 1, wherein the algebraic code is BCH code or RS code.

3. The partial concatenated coding system according to claim 1, wherein the stop condition is the maximum number of operations of the LDPC code decoding module used to decode the first message part, the second message part and the first parity part for one received codeword when a predetermined value is met, or decoding of the LDPC code decoding module for one received codeword is judged to be divergent.

4. The partial concatenated coding system according to claim 1, wherein the second message part and the first parity part of the received codeword with LLR values from the LDPC code decoding module are mapped to hard-bits before the algebraic code decoding module starts decoding processes.

5. The partial concatenated coding system according to claim 1, wherein when the algebraic code decoding module successfully processes decoding, all code-bits of the decoded message part from the algebraic code decoding module are kept the same sign and assigned the maximum or minimum soft-bit value.

6. The partial concatenated coding system according to claim 1, wherein after the algebraic code decoding module processes decoding, all code-bits of the decoded message part are kept soft-bits.

7. The partial concatenated coding system according to claim 1, wherein the current second message part and first parity part as the feedback message are assigned the same soft-bit values before algebraic code decoding when they are sent by the algebraic code decoding module.

8. The partial concatenated coding system according to claim 1, wherein if some bits in the message part are assigned as zero by the algebraic code encoding module, the algebraic code decoding module generates the decoded message part further when the zeros are recognized by comparison after decoding.

9. The partial concatenated coding system according to claim 1, wherein the predetermined stop value in a later run of the LDPC code decoding module for the codeword is larger than that in a current run of the LDPC code decoding module for the same codeword.

10. The partial concatenated coding system according to claim 9, wherein the predetermined stop value for each run is set based on physical conditions of the communication channel or the storage.

11. The partial concatenated coding system according to claim 1, wherein the information of the decoded message part is further sent to the received codeword monitoring module for determining the LLR values of the received codeword.

12. The partial concatenated coding system according to claim 1, further comprising a memory module, connected to the LDPC code decoding module and the algebraic code decoding module, for temporarily buffering information in the LDPC decoding module and the decoded message part and the first parity part from the LDPC code decoding module or the algebraic code decoding module, or the message part and the first parity part with LLR values, and the second parity part with hard-bits from the received codeword monitoring module.

* * * * *